United States Patent
Peschges

(10) Patent No.: US 6,372,173 B1
(45) Date of Patent: Apr. 16, 2002

(54) PROCESS FOR PRODUCTION OF THREE-DIMENSIONAL OBJECTS BY MEANS OF STEREOLITHOGRAPHY

(76) Inventor: Klaus-Jürgen Peschges, Hochschullehrer, Kirchstrasse 12, D-69514 Laudenbach (DE)

( * ) Notice: Subject to any disclaimer, the term of this patent is extended or adjusted under 35 U.S.C. 154(b) by 0 days.

(21) Appl. No.: 09/504,862

(22) Filed: Feb. 16, 2000

(30) Foreign Application Priority Data

Mar. 23, 1999 (DE) .......................................... 199 06 564

(51) Int. Cl.⁷ ............................ B02C 23/18; B02C 1/00; B29C 35/08; B29C 41/02; B29C 67/00
(52) U.S. Cl. ....................... 264/401; 241/15; 241/24.13; 241/24.18; 241/24.25; 241/24.28; 264/51; 264/53; 264/437; 264/442; 264/911; 264/916; 347/1
(58) Field of Search ........................... 264/51, 53, 401, 264/437, 442, 911, 916; 347/1; 241/15, 24.13, 24.18, 24.25, 24.28

(56) References Cited

U.S. PATENT DOCUMENTS

| 5,688,464 A | * | 11/1997 | Jacobs et al. ................ 264/401 |
| 5,932,309 A | * | 8/1999 | Smith et al. ................... 428/46 |
| 5,989,475 A | * | 11/1999 | Schulthess et al. ......... 264/401 |
| 6,099,787 A | * | 8/2000 | Melisaris et al. ........... 264/401 |

* cited by examiner

Primary Examiner—Leo B. Tentoni
(74) Attorney, Agent, or Firm—Fulbright & Jaworski LLP

(57) ABSTRACT

Process for production of three-dimensional objects by stereolithography in which a laser hardens particular areas of constantly succeeding layers of resin fluid. Prior to or during laser light action, the particles, which define physical or mechanical qualities of the object-to-be-produced, will be added into, and/or alternatively, will be produced within the resin fluid, leading to a resin-fluid-particle-mixture. The particles are integrated into the resin and/or compound with resin and/or other particles by means of laser light action or ultrasonic mixing.

12 Claims, No Drawings

PROCESS FOR PRODUCTION OF THREE-DIMENSIONAL OBJECTS BY MEANS OF STEREOLITHOGRAPHY

BACKGROUND OF THE INVENTION

1. Field of the Invention

In recent years, the following technique for production of three-dimensional objects has been widely used: Design by CAD-programs and then transformance of the design into objects by stereolithography. The present invention relates to a novel and improved process for the production of 3-D objects by means of stereolithography using laser hardening.

2. Description of the Related Technology

Until today, stereolithography has been limited to the production of design samples. Hardening is done by an ultraviolet laser which spreads over a basin filled with fluid resin and hardens the resin at selected areas. The objects so manufactured serve as samples for testing and checking purposes e.g. in respect of their installation characteristics and handling. These objects possess only minor strength and their use is limited as mentioned above.

An aim of the invention is to improve the process in order to manufacture objects with qualities that could not be reached with the aforementioned method, e.g. objects having high strength, thermal conductivity, specific surfaces and so on.

SUMMARY OF THE INVENTION

The invention solves the problem by use of a specific technique for production of three-dimensional objects by stereolithography and laser hardening. Prior to or during laser light action, particles which define physical and/or mechanical characteristics of the object-to-be-produced will be added into the resin fluid in order to achieve a liquid fluid-resin-particle-mixture. By action of laser light, the particles will be combined with the hardened resin and/or will be compound with themselves.

DETAILED DESCRIPTION OF THE INVENTION

There are numerous types of particles and numerous ways of adding them into the resin. Generally, it is possible to add particles in solid and/or liquid and/or gaseous condition into the fluid resin and distribute them therein. Moreover, the possibilities to modify such particles are nearly unlimited: e.g. use of particles with gas bubbles at their surface or at their inside to achieve an isolation effect, or use of particles which transform during laser light action into gaseous condition and thereby produce a hollow in the object-to-be-produced. Addition of particles of nanomaterial e.g. in form of nano metal or nano fluids is preferable if particular characteristics which result from the nanomaterial shall be achieved, e.g. a high conductivity (electric, magnetic or thermal).

A high thermal conductivity will be achieved, if mainly liquid resin particles, which lead to high conductivity after hardening, are added. When pouring in, the particles can be covered with a thin separation layer which prevents the particles from dissolving in the resin fluid.

Good results can be achieved if the particles are covered with a layer (preferably a liquid) which activates their connection with the resin or with themselves. It is possible to cover the particles with material, adapted for laser sintering, and include it in the resin fluid in high concentration or in agglomerating condition.

To evenly distribute the particles within the resin fluid, the resin-fluid-particle-mixture will be treated with ultrasonic waves which evenly distributes and preserves this condition.

One preferred mode of the process is to surface-activate particles prior to adding them into the resin fluid. Activation can be done in different ways. The particles can, for example, be plasma-activated. Particles of metal or a metal compound will normally be chemically activated. Activation can also be achieved by specific nano materials, preferably in liquid condition.

It is advantageous for many objects to have particular qualities at a particular place in the object, e.g. if the surface of the object shall be of high thermal conductivity or pollution-proof. In such a case, it is possible to selectively add the particles so as to receive a higher concentration of particles at specific parts of the object. Selective addition of particles may done analoguous to ink or silk screen printing techniques. It is also possible to subject non-metal particles before hardening of the resin-fluid-particle-mixture to an electromagnetic orientation process.

In some cases it can be of advantage to treat the resin fluid twice with laser light action, directly one after another, the first of which will be performed with reduced energy. This method is recommendable if gaseous particles are added into the resin fluid. By the first energy-reducing initial laserbeam, a higher temperature of the mixture is achieved and the size of the gas bubbles will increase. The directly succeeding "normal" laser treatment will do the final hardening. It is, however, also possible to dissolve gaseous particles in the resin fluid and to transform them partially into gas bubbles by initial laser beam. Size of gas bubbles can be varied by varying the intensity and/or duration of the laser treatment.

A considerable advantage of the objects produced by the above described method is their recyclability. Objects can be re-separated into their original materials. Recycling can be done by grinding the object with liquid nitrogen and sorting the resin and particles.

EXAMPLES

Manufacturing of an object, e.g. an art-designed paper weight can be executed as follows: Production of resin fluid under addition of titan powder which will result in a resin-fluid-titan-mixture. From this mixture the paper weight will be formed by means of stereolithography. The titan particles are combined with the resin fluid and the paper weight will therefore be comparable in shape, weight and gloss with a paper weight made of pure titan. With the same process, but with addition of different particles, other objects with specific features can be produced. All other stereography known today are not appropriate for production of said objects.

The new process also bears the possibility to directly manufacture tooling inserts, without use of an intermediate moulding form. To manufacture such a tooling insert, resin-fluid is used. Particles which will give the tooling insert high strength after the hardening process are added to the resin. Suitable particles can, for example, be metal or a metal powder. From a resin-fluid-metal-particle-mixture a basic object will be produced by means of stereolithography. The outer shape of the basic object will be appropriate for bandaging. By stereolithography,the basic object can be equipped with channels which will serve for cooling or heating of the tool during use in production by serving as a conduit for adding warm or cool air or an exhaust for removing hot air.

The inside surface of the tooling insert which substitutes for the injection moulding product can be covered with further particles to achieve a specific quality of the surface. To keep pollution low, PTFE particles or a nano fluid with fluorine properties can be added into the resin. The powder or nano material will be compound with the resin and will form the surface. It is also possible to keep wear and tear low at particular parts of the tooling insert, e.g. at the tooling insert's edges, by addition of a metal-powder-resin to reinforce the insert at this point.

The so manufactured tooling insert can directly be used for serial production of objects.

What is claimed is:

1. A process for producing a three-dimensional object by stereolithography, comprising:

providing a resin fluid capable of laser hardening;

adding particles responsible for predetermined qualities of the three-dimensional object to said resin fluid to produce a resin-fluid-particle-mixture; and laser hardening said resin-fluid-particle-mixture to produce said three-dimensional object;

wherein said particles are a physical state selected from the group consisting of solids, liquids, gases, solid-liquids, solid-gases, and liquid-gases;

wherein said particles in the solid or liquid state have gas bubbles on an outer surface of said particles or in an internal area of said particles.

2. A process for producing a three-dimensional object by stereolithography, comprising:

providing a resin fluid capable of laser hardening;

adding particles responsible for predetermined qualities of the three-dimensional object to said resin fluid to produce a resin-fluid-particle-mixture; and laser hardening said resin-fluid-particle-mixture to produce said three-dimensional object;

wherein at least some of the said particle transform into a gas during laser hardening.

3. A process for producing a three-dimensional object by stereolithography, comprising:

providing a resin fluid capable of laser hardening;

adding particles responsible for predetermined qualities of the three-dimensional object to said resin fluid to produce a resin-fluid-particle-mixture; and laser hardening said resin-fluid-particle-mixture to produce said three-dimensional object;

wherein said particles comprise a nano material selected from the group consisting of nano metals and nano fluids.

4. A process for producing a three-dimensional object by stereolithography, comprising:

providing a resin fluid capable of laser hardening;

adding particles responsible for predetermined qualities of the three-dimensional object to said resin fluid to produce a resin-fluid-particle-mixture; and laser hardening said resin-fluid-particle-mixture to produce said three-dimensional object;

wherein the step of treating said resin-fluid-particle-mixture is with ultrasonic waves, thereby evenly distributing said particles within said mixture.

5. A process for producing a three-dimensional object by stereolithography, comprising:

providing a resin fluid capable of laser hardening;

adding particles responsible for predetermined qualities of the three-dimensional object to said resin fluid to produce a resin-fluid-particle-mixture; and laser hardening said resin-fluid-particle-mixture to produce said three-dimensional object;

wherein said particles comprising a synthetic material and are plasma-activated prior to being added to said fluid resin.

6. A process for producing a three-dimensional object by stereolithography, comprising:

providing a resin fluid capable of laser hardening;

adding particles responsible for predetermined qualities of the three-dimensional object to said resin fluid to produce a resin-fluid-particle-mixture; and laser hardening said resin-fluid-particle-mixture to produce said three-dimensional object;

wherein said particles comprising a metal and are chemically-activated prior to being added to said resin fluid.

7. The process of claim 6, wherein said particles are activated by nano materials.

8. A process for producing a three-dimensional object by stereolithography, comprising:

providing a resin fluid capable of laser hardening;

adding particles responsible for predetermined qualities of the three-dimensional object to said resin fluid to produce a resin-fluid-particle-mixture; and laser hardening said resin-fluid-particle-mixture to produce said three-dimensional object;

wherein said particles are added selectively.

9. The process of claim 8 wherein said selective adding is carried out by ink jet printing or silk sreen printing techniques.

10. A process for producing a three-dimensional object by stereolithography, comprising:

providing a resin fluid capable of laser hardening;

adding particles responsible for predetermined qualities of the three-dimensional object to said resin fluid to produce a resin-fluid-particle-mixture; and laser hardening said resin-fluid-particle-mixture to produce said three-dimensional object;

wherein said at least some of said particles are capable of being affected by a magnetic field and are subjected to electro-magnetic orientation prior to laser hardening.

11. A process for producing a three-dimensional object by stereolithography, comprising:

providing a resin fluid capable of laser hardening;

adding particles responsible for predetermined qualities of the three-dimensional object to said resin fluid to produce a resin-fluid-particle-mixture; and laser hardening said resin-fluid-particle-mixture to produce said three-dimensional object;

wherein said laser hardening step comprises treating said resin-fluid-particle mixture with a laser twice, and wherein said first treatment heats the mixture and said second treatment hardens the mixture.

12. A process for producing and recycling a three-dimensional object comprising:

providing a resin fluid capable of laser hardening;

adding particles responsible for predetermined qualities of the three-dimensional object to said resin fluid to produce a resin-fluid-particle-mixture;

laser hardening said resin-fluid-particle-mixture to produce said three-dimensional object;

grinding said object in the presence of liquid nitrogen; and sorting said resin from said particles.

* * * * *